United States Patent [19]

Hokbrook et al.

[11] Patent Number: 4,920,315

[45] Date of Patent: Apr. 24, 1990

[54] HEAD OR BODY COIL ASSEMBLY FOR MAGNETIC RESONANCE IMAGING APPARATUS

[75] Inventors: James G. Hokbrook, Mountain View; Otto J. Jaks, Los Altos, both of Calif.

[73] Assignee: Resonex, Inc., Sunnyvale, Calif.

[21] Appl. No.: 88,680

[22] Filed: Aug. 24, 1987

Related U.S. Application Data

[63] Continuation-in-part of Ser. No. 890,603, Jul. 25, 1986, abandoned.

[51] Int. Cl.⁵ .............................................. G01R 33/20
[52] U.S. Cl. ..................................... 324/313; 374/322
[58] Field of Search ................ 324/313, 316, 318, 322

[56] References Cited

U.S. PATENT DOCUMENTS

| | | | |
|---|---|---|---|
| 4,594,566 | 6/1986 | Maudsley | 324/318 |
| 4,725,780 | 2/1988 | Yoda et al. | 324/318 |
| 4,755,756 | 7/1988 | Nishihara et al. | 324/322 |

FOREIGN PATENT DOCUMENTS 0031978  2/1986  Japan .................................. 324/313

OTHER PUBLICATIONS

Schneider, H. J. et al., "Slotted Tube Resonator: A New NMR Probe Head at High Observing Frequencies", Rev. Sci. Instrum., vol. 48, No. 1, Jan. 1977, pp. 68–73.

Primary Examiner—Michael J. Tokar
Assistant Examiner—Lawrence Fess
Attorney, Agent, or Firm—Flehr, Hohbach, Test, Albritton & Herbert

[57] ABSTRACT

A head or body coil assembly for picking up signals in an MRI system is provided. It includes a band of conductive material which surrounds the specimen to be tested but which forms a gap substantially parallel to the axis of the curved band. An overlapping conductive section overlaps the gap at the adjacent ends to form respective capacitors with these ends. A ground connection in taken off from the overlapping section and a signal output lead is attached to one of the ends. Auxiliary variable capacitors are provided for balancing the system and for tuning it into resonance.

4 Claims, 2 Drawing Sheets

HEAD OR BODY COIL ASSEMBLY FOR MAGNETIC RESONANCE IMAGING APPARATUS

This is a continuation-in-part of application Ser. No. 890,603 filed July 25, 1986 now abandoned.

The present invention is directed to a head or body coil assembly for picking up free induction decay or spin-echo signals from a test specimen (for example for a human), produced in a magnetic resonance imaging (MRI) apparatus.

Head or body coils are necessary in MRI apparatus. They are commonly used both for providing radio frequency (RF) excitation signals and thereafter receiving a spin-echo or free induction decay signal indicating a characteristic of the specimen being examined. Since the so-called pickup signal is of a very small magnitude, it is important to maximize the signal above the ambient noise level. And it is desired to do the above without adversely affecting the various magnetic fields involved in the measurement procedure itself.

OBJECTS AND SUMMARY OF THE INVENTION

Thus it is an object of the present invention to provide an improved head or body coil for MRI apparatus.

In accordance with the above object, there is provided a head or body coil assembly for picking up free induction decay or spin-echo signals from a test specimen produced in an MRI apparatus. The assembly comprises inductive pickup coil means for substantially surrounding the specimen including a relatively thin band of conductive material curved around an axis and having two ends forming a gap substantially parallel to the axis. A conductive section overlaps this gap and is spaced from the two ends to form a respective capacitor with each of the ends. A first conductive lead is attached to the overlapping section and forms an effective ground. A second conductive lead is attached to one of the ends of the pickup coil means and provides a signal output with respect to ground.

A BRIEF DESCRIPTION OF DRAWINGS

DESCRIPTION OF PREFERRED EMBODIMENT

Figure 1:
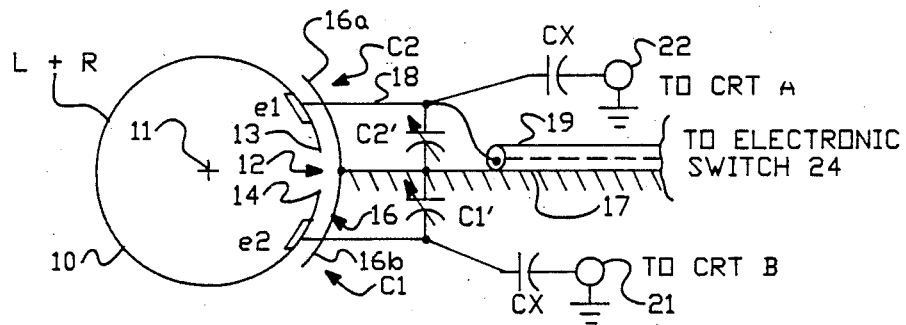
FIG. 1 is a circuit schematic of a portion of the coil assembly embodying the present invention.
Figure 3:
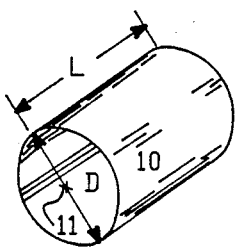
FIG. 3 is a perspective view of a portion of the coil assembly of the present invention.

As illustrated in FIG. 1, the coil assembly of the present invention is shown as, for example, a relatively thin band 10 of conductive material (for example, copper) which has an axis 11 around which it is curved and forms a gap 12 by its two ends 13 and 14. The pickup coil 10 is actually, as illustrated in FIG. 3 in the shape of a cylinder, and is suitable for surrounding, for example, the head of a human being which has been inserted in the MRI apparatus. Very typical dimensions could be a diameter D of 10 inches, a length L of 12 inches, with the thickness of the sheeting being 0.002 inches. Although a so-called head coil is illustrated in this embodiment a body coil would be of an equivalent shape, perhaps flattened somewhat and of a larger diameter to accommodate the torso, for example, of a human being. In addition, the head coil may be used on arms or legs.

Referring back to FIG. 1, gap 12 is, of course, parallel to the axis 11. A conductive section 16 overlaps the gap 12 and the ends 13 and 14 along the full axial length of gap 12 and includes a first section 16a which forms a capacitor C2 in combination with end 13 and a section 16b which forms a capacitor C1 with end 14. The total circumferential length of the curved section 16, in this specific embodiment, is eight inches. It is not shown in the simplified diagram of FIG. 3. Connected to conductive section 16, is a first conductive lead 17 which forms an effective ground. The conductive lead, in actual practice, may be a thin aluminum plate which is affixed to section 16. A second conductive lead 18 is connected to end 13 at a point designated as $e_1$, (and this is conductive connection, of course) and lead 18 provides a signal output. It is actually the center of a coaxial cable 19 which has as its outer shield the ground lead 17.

In parallel with capacitor C1 formed by end 14 and overlapping section 16b, is a variable capacitor C1'. This capacitor C1' has one end connected to ground 17 and the other to the point designated $e_2$ on end 14. There is also connected to this point a capacitor $C_x$ (which is of very low capacitance, for example, 2pF) which is connected to an output fitting 21. A similar capacitor $C_x$ and a fitting 22 is connected to the signal lead 18. Also connected to output lead 18 is a variable capacitor C2' which in essence is in parallel with capacitor C2 which is connected between lead 18 and ground.

Figure 2:
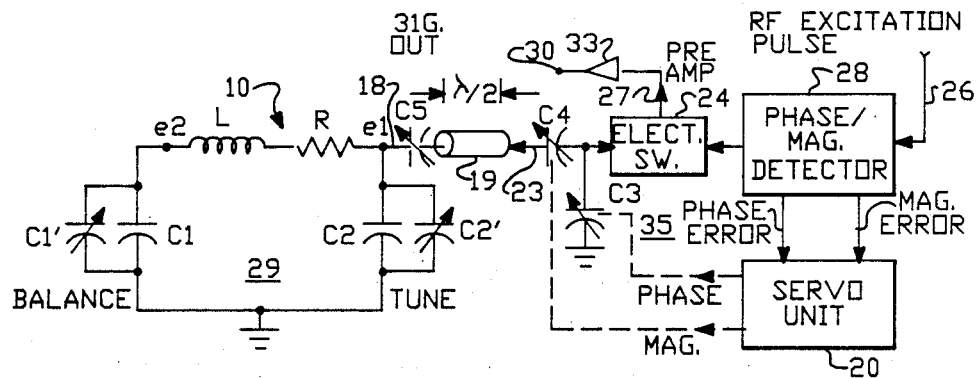
FIG. 2 is circuit schematic showing the overall coil assembly embodying the present invention and representing a portion of FIG. 1 in equivalent circuit format.

FIG. 2 illustrates the equivalent circuit of FIG. 1, and includes the inductance of the coil 10 designated L, and its resistance which is due both to the resistance of the copper sheeting and to the specimen therein, designated R. Also shown are a primary network 29 comprising the capacitors C1 and C2 and their parallel variable capacitors C1' and C2'. Also, the voltage points $e_1$ and $e_2$ are shown. Finally, an optional capacitor C5 may be connected to point $e_1$ as part of the primary network for tuning use for smaller coil diameters such as for heads, arms and legs.

The transmission line 19 connected to the lead 18 and the voltage point $e_1$ is one-half wavelength long, the wavelength being at the frequency of the signal output which signal is to be picked up and which contains the MRI information. This typically is approximately 16 MHz or is the angular frequency of procession. In accordance with basic MRI theory the radio frequency (RF) excitation pulse is, of course, substantially the same frequency. The half wavelength transmission line is chosen since it has the characteristic of having the same impedance at its output end as it sees at its input end. In this case it is a common 50 ohm transmission line. At the output end 23 of the transmission line is an electronic switch 24, which switches between RF excitation pulse input 26 (which is for well-known MRI purposes) and the output signal circuit, including line 27, pre-amplifier 33 and output signal terminal 30. A secondary network 35 includes a series adjustable capacitor C4 between line 19 and electronic switch 24, another adjustable capacitor C3 which is grounded from electronic switch 24, a phase magnitude detector 28 which has phase error and magnitude error outputs which drive the servo unit 20, which in turn is coupled via actuating links including a phase link to capacitor C3 and a magnitude link to capacitor C4. Phase magnitude detector 28 is an off the shelf device which will tune for 0° phase error and 50 ohms magnitude. This is theoretically done for the received spin echo signal on line 27. But from a practical standpoint, since the RF excitation pulse on line 26 is the same frequency, the actual tuning is done as will be discussed below with the excitation pulse on line 26 rather than the relatively weak spin echo signal.

Referring to the equivalent circuit of the pickup coil 10 which is illustrated at 29 in greater detail, the inductance L is relatively unchanging with respect to the specimen within the coil 10. However the loss resistance R will vary in accordance with the specimen or patient placed within the coil 10 and thus will affect the impedance or tuning of the system.

Figure 4:
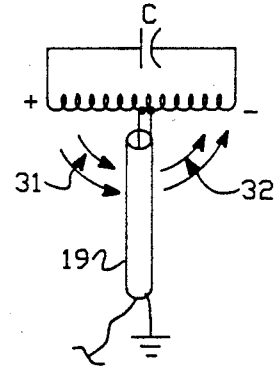
FIG. 4 is an equivalent circuit, useful in understanding the present invention.

FIG. 4 shows an equivalent circuit of the pickup coil as illustrated schematically at 29 in FIG. 2. The transmission line 19 is conducted to a mid-point of the inductance L with the lumped capacitor C across the ends of the inductance L. From an optimum operational point of view, it is desired that the transmission line 19 tap off the voltage from the coil or inductance L at its effective zero impedance point. This is to minimize the displacement currents or rather cancel them out as illustrated by the flux lines 31 and 32. If these displacement currents can be exactly balanced, then they will prevent any RF current from flowing on the outside of transmission line 19, (FIG. 2).

The main advantage of having a balanced system is that the overall system is more immune to movement of the human or specimen within the pickup coil 10. This is because if a human moves from side-to-side, for example, closer to one part of the pickup coil than another, with a net displacement current, such movement would be magnified. However, with the balanced system shown in FIG. 4, it can be regarded as a second order effect.

To achieve the effect illustrated in FIG. 4, the present invention provides the structure shown in FIG. 1 including the band 10 with the gap 12. In addition, as illustrated in FIG. 2, to provide for a fully balanced condition, the capacitor C1' is provided which, when adjusted to the proper value, will provide a balance. Such balance is theoretically true when the ratio of voltage $e_1$ to $e_2$ is equal to a minus one. The voltage $e_1$ is, in effect, the output voltage being coupled into the transmission line 19.

Referring to the equations page at the end of the specification, Equation 1 shows the ratio of these voltages where the significant capacitor C is C1 paralleled with C1'. The capacitor C2 does not significantly affect balance.

Equation 2 indicates that the imaginary term of the equation can be disregarded. Equation 3 shows the condition for balance as discussed above. Substituting equations 2 and 3 in equation 1 yields equation 4 and then rearranging gives the value of the capacitance (that is C1 in combination with C1') needed for balance. This is, in effect, proportional to the inductive reactance. The frequency in the equations is, of course, the frequency of the signal to be picked up and is substantially 16 MHz.

The capacitance C (C1' and C1), can be pre-adjusted for the value listed in equation 5. An alternative technique is, rather than making physical measurements of inductance, the connectors 21 and 22, illustrated in FIG. 1, are coupled to the A and B signal inputs of a cathode ray tube through any length of terminated transmission line. An AC signal is imposed on transmission line 19, and the magnitude of the output signals shown on the oscilloscope are made equal by adjustment of the capacitor C1'. It has been found that this results in substantially the same value of capacitance as shown in equation 5. The size of the coupling capacitors $C_x$ are small enough so as to have no effect on the circuit.

Thus, by the above adjustment of C1', a balanced condition is achieved as illustrated in FIG. 4.

Because the signal being picked up or sensed by coil 10 is such a small amplitude, the transfer of energy from the coil 10 through transmission line 19 to the electronic switch 24 and pre-amplifier 33 to the signal output terminal 30 must be optimized. Such condition is obtained by matching the real impedance of the system (meaning the resistance of the coil 10) with the characteristic impedance of transmission line 19 (in this case 50 ohms), and placing the overall circuit in a resonance condition; in other words, eliminating imaginary components due to inductance and capacitance and resonating or stepping up the real impedance of the system to the characteristic impedance of line 19; thus, this avoids reflections.

The foregoing maximum signal transfer is provided for as succinctly illustrated in FIG. 2 by the use of a primary network 29 and a remote secondary network 35. The secondary network of course includes the servo unit 20 which may include electric motors and other accessory equipment. This could not be tolerated in the main magnetic field and thus the primary network 29 is of a relatively simple design with just a few basic nonmagnetic capacitive elements. These will not affect the main magnetic field. The secondary network 35 is removed from the high field region by using the long (30 feet, for example) half wavelength transmission line 19. The overall efficiency of the circuit in FIG. 2 is optimized by nearly matching the real impedance of the primary network and coil to the characteristic impedance of line 19. In general, the tuning process is multistep, as illustrated more fully in FIG. 6. Because of the capacitive components the primary network 29 is tuned to a condition close to resonance, for example, 40 +j50, and then the maximum signal transfer condition for the overall circuit of 50 +j0 is achieved by the secondary network 35 in conjunction with the automatic servo unit 20 driven by phase/magnitude detector 28. Care must be taken to avoid the real impedance of primary network 29 exceeding 50 ohms; otherwise, the capacitive secondary network 35 will not be able to complete the matching process.

Figure 6:
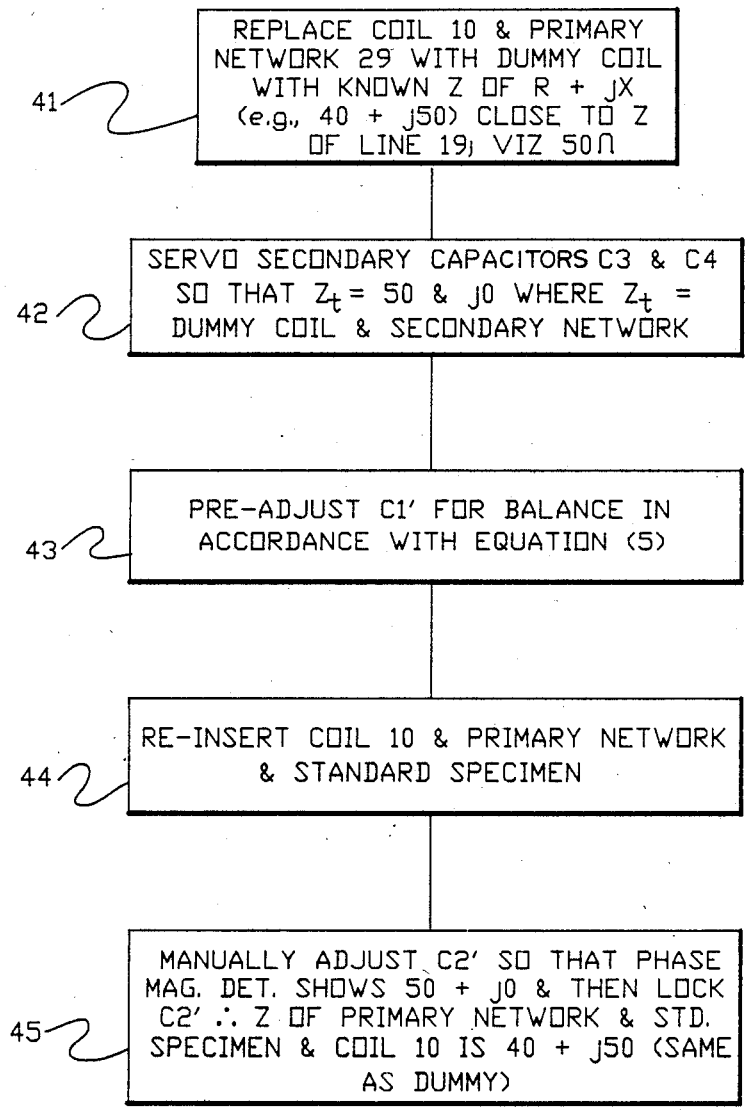
FIG. 6 is a flow chart showing a process of the invention.

Referring to FIG. 6 which shows the steps required for the foregoing, in the first step 41, the coil 10 and its primary network 29 is replaced with a dummy coil with a known impedance of R +jX and specifically, for the capacitive tuning situation in the present environment of 40+j50. This is close to the characteristic impedance of 50 ohms of line 19, which will eventually be required for maximum signal transfer.

Next, as shown by step 42 with a dummy network in place (in other words, al of the primary network 29 has been removed and the dummy network is plugged into the end of transmission line 19), the servo unit 20 and phase magnitude detector 28 is utilized with an RF excitation pulse 26 to adjust capacitors C3 and C4 so that the total impedance $Z_t$ is equal to 50+j0. Here the $Z_t$ is the sum of the dummy coil impedance, plus the impedance of the secondary network 35.

In step 43 the capacitor C1' has been preadjusted for balance in accordance with equation 5.

In step 44, the actual coil 10 is reinserted along with primary network 29 along with a standard specimen. This specimen may be a container of, for example, salt water, or an actual resistive impedance network since the specimen affects the overall resistance of coil 10.

Finally, in step 45, the capacitor C2' is manually adjusted so that the phase magnitude detector 29 shows the desired condition of maximum transfer and resonance; that is $50+j0$. C2' is then locked. In this situation, the impedance of the primary network 29, including the standard specimen and coil 10, is of course the same as the original dummy coil; that is $40+j50$.

The foregoing is what might be termed an on site or factory calibration. When an actual specimen or patient is inserted in the coil 10, it is assumed that the actual load will be similar to that assumed with the dummy coil. Thus, the servo unit 20 is allowed to operate to adjust C3 and C4 to provide a 0° phase relationship and matched impedance magnitude.

Figure 5:
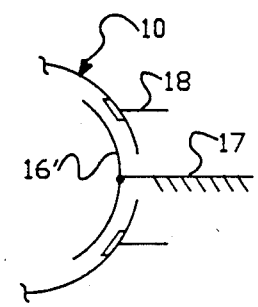
FIG. 5 is a circuit schematic of an alternate embodiment of FIG. 1.

FIG. 5 illustrates how the shield for overlapping section 16 may be on the interior (now designated as 16') of the coil 10. The circuit connections are the same as indicated, however. This may provide for improved operation in many circumstances.

As discussed above, the thickness of coil 10 with the frequencies being used in the present invention is approximately 0.002 inches. This thickness is comparable to the skin depth of the output signal (in this specific case the spin-echo signal) which is approximately 16 MHz (and more specifically 16.2 MHz). Skin depth can be defined from an antenna efficiency standpoint as the depth from the outer surface of the conductor within which the total current substantially contained; viz., 1/e. It is inversely proportional to the square root of frequency. If the thickness of the conductor is greater than three times the skin depth, any further increase in thickness will not significantly improve efficiency by decreasing the ohmic power loss. Thus, the present invention utilizes a thickness of 2 mils where the skin depth at 16.2 MHz is 0.64 mil.

Thus, by providing a thin band of conductive material having a thickness comparable to skin depth at the spin echo frequency an optimal signal pickup is provided.

At the same time, with the gradient coils utilized in magnetic resonance imaging having a frequency at least two orders of magnitude lower, for example, typically one (1) KHz or less, the thin band type pick-up coil is substantially transparent to the gradient fields. In other words, the coil has a thickness significantly less than the skin depth at the gradient frequency, making the attenuation minimal.

The decibel attenuation is arrived at by multiplying a constant times the thickness of the copper band, multiplied by the square root of the frequency. As a function of skin depth, attenuation is related to thickness divided by skin depth. Thus, where the thickness is significantly less than the computed skin depth, as is true of the gradient frequency, attenuation is indeed minimal. For the present frequencies, the effective skin depth can be calculated with the 16.2 MHz frequency having a 0.64 mil skin depth and the 1 KHz 81.5 mils skin depth. Thus, with a copper band of two mils thickness at a frequency of 1 KHz, the attenuation in decibels is a minimal 0.21; in contrast, the attenuation for a pick-up signal at 16.2 MHz is 26.8 decibels.

With the foregoing thickness where the skin effect comes into play with regard to the spin-echo signal, the pick-up coil 10 acts as a flux tube forcing the flux through any cross section to be the same. It does this by having the current at the ends of the tubular sheet rather than at the center and the proper distribution occurs automatically; no balancing is needed.

The copper band 10 with its overlapping section also shields the test specimen from extraneous external fields produced in the vicinity of the high voltage gap 12 (FIG. 1). See also FIG. 5 for improved reduction of electric fields inside the coil.

Thus an improved head and body coil assembly for MRI use has been provided.

| EQUATIONS |
| --- |
| (1) $\dfrac{e_1}{e_2} = 1 - \omega^2 LC + jR\omega C$ where $C° = C1 + C1'$ |
| (2) Assume $jR\omega C \approx 0$ |
| (3) For Balance $\dfrac{e_1}{e_2} = -1$ |
| (4) Therefore $\omega^2 LC = 2$ |
| (5) Then $C = \dfrac{2}{\omega^2 L}$ |

What we claim is:

1. A head or body coil assembly for picking up free induction decay or spin-echo signals from a test specimen produced in a magnetic resonance imaging apparatus comprising:

inductive pick-up coil means for substantially surrounding said test specimen including a relatively thin band of conductive material curved around an axis and having first and second ends forming a gap substantially parallel to said axis;

a conductive section overlapping said gap and spaced from said ends to form a respective first and second capacitor with each of said ends;

a first conductive lead attached to said overlapping section and forming an effective ground;

a second conductive lead attached to said first end and providing a signal output with respect to said ground;

and means for adjusting the capacitance of said second capacitor formed by said second end of said conductive band for electrically balancing said coil assembly, including a first variable capacitor connected between said second end and ground, and where the capacitance of said first variable capacitor is adjusted so that the total capacitance, C, of said variable capacitor and said capacitor formed by said second end is equal to $2/\omega^2 L$ where L is the inductance of said coil means and $\omega$ is the frequency of said signals to be picked up.

2. A coil assembly as in claim 1 including variable capacitor means connected between said second lead and said ground for tuning said coil means close to a resonance condition.

3. A coil assembly as in claim 1 where said overlapping section is inside said thin band whereby the test specimen is shielded from extraneous external fields.

4. A head or body coil assembly for picking up free induction decay or spin-echo signals for a test specimen produced in a magnetic resonance imaging apparatus comprising:

inductive pick-up coil means associated with said test specimen for receiving said signals;

signal processing means connected to said coil means for providing said induction decay or spin-echo signals, including primary and secondary matching networks, said primary network being in close proximity to said pick-up coil means and said secondary matching network being remote from said pick-up coil means;

said primary and secondary matching networks being connected by a transmission line having a length equal to one-half the wavelength of said signal to be picked up and having a predetermined impedance;

said secondary network including means for detecting phase and magnitude of an RF signal having the wavelength of the signal to be picked up and impressed on said secondary and primary networks, said coil, and said test specimen, and including adjustable capacitors responsive to said detecting means for providing an impedance equal to said characteristic impedance with a 0° phase to provide optimum power transfer.

* * * * *